US010364324B2

(12) United States Patent
Tan et al.

(10) Patent No.: US 10,364,324 B2
(45) Date of Patent: Jul. 30, 2019

(54) POLY(2,6-DIMETHYL-1,4-PHENYLENE-OXIDE) DERIVATIVES WITH SULFONYL PENDANT GROUPS AND METHODS THEREFOR

(71) Applicant: The United States of America, as represented by the Secretary of the Air Force, Washington, DC (US)

(72) Inventors: Loon-Seng Tan, Centerville, OH (US); David Huabin Wang, Beavercreek, OH (US); Lei Zhu, Solon, OH (US)

(73) Assignee: The United States of Ameirca as represented by the Secretary of the Air Force, Washington, DC (US)

( * ) Notice: Subject to any disclaimer, the term of this patent is extended or adjusted under 35 U.S.C. 154(b) by 104 days.

(21) Appl. No.: 15/679,724

(22) Filed: Aug. 17, 2017

(65) Prior Publication Data
US 2019/0055355 A1 Feb. 21, 2019

(51) Int. Cl.
C08G 65/44 (2006.01)
C08G 65/48 (2006.01)
C08G 65/40 (2006.01)
G01R 33/46 (2006.01)

(52) U.S. Cl.
CPC ......... *C08G 65/44* (2013.01); *C08G 65/4056* (2013.01); *C08G 65/485* (2013.01); *C08G 2650/56* (2013.01); *G01R 33/46* (2013.01)

(58) Field of Classification Search
CPC .. C08G 65/44; C08G 65/485; C08G 2650/56; G01R 33/46
USPC ....................................................... 524/208
See application file for complete search history.

(56) References Cited

U.S. PATENT DOCUMENTS 3,226,361 A 12/1965 Borman
3,259,592 A 7/1966 Fox et al.
3,262,892 A 7/1966 Hay
3,262,911 A 7/1966 Hay
3,378,505 A 4/1968 Hay
3,402,144 A 9/1968 Hay
3,479,409 A 11/1969 Hall
3,522,326 A 7/1970 Bostick et al.
4,521,224 A 6/1985 Li
4,596,860 A 6/1986 Percec et al.
4,647,297 A 3/1987 Zampini
4,673,717 A 6/1987 Percec et al.
4,684,376 A 8/1987 Percec et al.
7,345,135 B2 3/2008 Ishikawa et al.
7,781,537 B2 8/2010 Birsak et al.
8,710,109 B2 4/2014 Linder et al.
8,859,672 B2 10/2014 Peters

OTHER PUBLICATIONS

Vukovic et al., Polymer, 34(7), 1449-1453, 1993. (Year: 1993).*
J. Wei et al, "Acheiveing High Dielectric Constant and Low Loss Property in a Dipolar Glass Polymer Containing Strongly Dipolar and Small-Sized Sulfone Groups," ACS Appl. Mater. & Interf., vol. 7 (2015) 5248-5257.
T. Xu et al., "Poly92,6-Dimethyl-1,4-Phenylene Oxide) (PPO)—A Versatile Starting Polymer for Proton Conductive Membranes (PCMs)," Prog. Polym. Sci., vol. 33 (2008) 894-915.
A. S. Hay, "Chemical Modification of Poly(Phenylene Oxide)s (Review)," In Polyphenylene Oxide and Modified Polyphenylene Oxide Membranes; Chowdhury, G., Kruczek, B., Matsuura, T., Eds.; Springer, 2001; pp. 1-26.
S. Percec, "Chemical Modification of Poly(2-6-Dimethyl-1,4-Phenylene Oxide) by Friedel-Crafts Reactions," J. Appl. Polym. Sci., vol. 33 (1987) 191-203.
A. Fachetti, et al., "Gate Dielectrics for Organic Field-Effect Transistors: New Opportunities for Organic Electronics," Adv. Mater., vol. 17 (2005) 1705-1725.
Y. Bai et al., "High Dielectric-Constant Ceramic-Powder Composites," Appl. Phys. Lett., vol. 76 (2000) 3804-3806.
Q. M. Zhang, "An All-Organic Composite Actuator Material With a High Dielectric Constant," Nature., vol. 419 (2002) 284-287.
R. H. Ulrich, R.K. "Introduction," In Integrated Passive Component Technology; Ulrich R. H., Schaper L. W., Eds.; IEEE Press, Wiley-Interscience, 2003, 1-32.

(Continued)

*Primary Examiner* — Hui H Chin
(74) *Attorney, Agent, or Firm* — AFMCLO/JAZ; Chastity Whitaker

(57) ABSTRACT

A sulfonyl-substituted polyphenylene-ether polymer having improved dielectric properties and methods for making the same. The sulfonyl-substituted PPE include sulfone-containing polyphenylene oxides ("PPO") polymers having repeating units of the formulas:

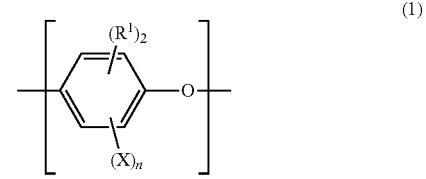

(1)

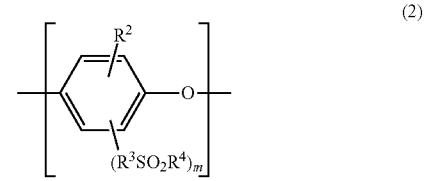

(2)

wherein each of $R^1$ and $R^2$ is H or an alkyl group containing from 1 to 4 carbon atoms, $R^3$ is an alkylene group containing from 1 or 2 carbon atoms, $R^4$ is selected from a group consisting of an alkyl group containing from 1 to 4 carbon atoms, an aryl group, and $CF_3$, and X is a halogen atom. The subscript n is 0 or 1; the subscript m is 1 or 2, provided that when m is 2, $R^2$ is H. A degree of polymerization ranges from about 5 to about 1,000, and a ratio of units having formula (1) to units having formula (2) of the sulfone-containing PPO polymer ranges from about 10:90 to about 90:10.

12 Claims, 6 Drawing Sheets

(56) References Cited

OTHER PUBLICATIONS

S. Wu et al., "Strong Dipolar Polythiurea and Polyurea Dielectrics With High Electrical Breakdown, Low Loss, and High Electrical Energy Density" J. Electr. Mater., vol. 43 (2014) 4548-4551.
N. Venkat et al., "High Temperature Polymer Film Dielectrics for Aerospace Power Conditioning Capacitor Applications," Mater. Sci. & Eng., B, vol. 168 (2010) 16-21.
J. Ho et al., "Chacterization of High Temperature Polymer Thin FILS for Power Conditioning Capacitors," Army Research Laboratory, Technical Report ARL-TR-4880 (2009) 28 pages total.
W. J. Sarjeant et al., "Capacitive Components for Power Electronics," Proc. IEEE, vol. 89 (2001) 846-855.
H. Wen et al., "Analysis and Evaluation of DC-Link Capacitors for High-Power-Density Electric Vehicle Drive Systems," IEEE Trans. Vehicular Tech., vol. 61 (2012) 2950-2964.
C. Zou et al., "PEN/Si3N4 Bilayer Film for DC Bus Capacitors in Power Converters in Hybrid Electric Vehicles," J. Vac. Sci. & Tech. B, vol. 29 (2011) 061401.1-061401.4.
D. Montanari et al., "Film Capacitors for Automotive and Industrial Applicaitons," Proc. CARTS, vol. 29 (2009) 11 pages total.
S. Zhang et al., "High Energy Density Film Capacitors," IEEE Pulsed Power Conf., vol. 1&2 (2009) 779-783.
Y. Wang et al., "Recent Development of High Energy Density Polymers for Dielectric Capacitors," IEEE Trans. Dielect. Elect. Insul., vol. 17 (2010) 1036-1042.
F. MacDougalli et al.,"Large High Energy Density Pulse Discharge Capacitor Characterization," In IEEE Intern'l Pulsed Power Conf., (2005) 1215-1218.
J. Veres et al., "Gate Insulators in Organic Field-Effect Transistors," Chem. Mater., vol. 16 (2004) 4543-4555.
A. S. Hay, "Polymerization by Oxidative Coupling: Discovery and Commercialization of PPO and Noryl Resins," J. Polym. Sci., Part A: Polym. Chem., vol. 36 (1998) 505-517.
D. M. White, "Poly(Phenylene Ether) Matrix Resins," Wiley Encyclopedia of Composites, 2nd Ed. (2012) 1-7.
Y. Seike, "Synthesis of Polyphenylene Ether Derivatives; Estimation of Their Dielectric Constants," Macromol. Chem. Phys., vol. 204 (2003) 1876-1881.
S. Percec et al., "Chemical Modification of Polyl(2,6,-Dimethyl-1,4-Phenyelene Oxide and Properties of the Resulting Polymers," Polym. Prepr., vol. 27 (1986) 19 and 20.
S. Percec et al., "Chemical Modification of Polyl(2,6,-Dimethyl-1,4-Phenyelene Oxide and Properties of the Resulting Polymers," ACS Symp. Ser., vol. 364 (1988) 46-59.
I. Cabasso et al.,"Phosphorylation of Methylbrominate Poly(Phenylene Oxide) by Hyrdoquinone Phosphate," J. Polym. Sci.: Polym. Chem. Ed., vol. 12 (1974) 1141 and 1142.
I. Cabasso et al., "Synthesis and Characterization of Polymers Iwth Pendent Phosphonate Groups," J. Appl. Polym. Sci., vol. 18 (1974) 1969-1986.
A. S. Hay et al., , "Metalation of Polyphenylene Ethers," Polym. Lett., vol. 6 (1968) 105-107.
A. J. Chalk et al., "Direct Metalation of Poly(2,6-Dimethyl-1,4-Phenylene Ether)," J. Pol. Sci. A-I, vol. 7 (1969) 691-705.
A. J. Chalk et al., "Anionic Graft Polymerization of Lithiated Poly(2,6-Dimethyl-1,4-Phenylene Ether)," J. Polym. Sci., Part A-I, vol. 7 (1969) 2537-2545.
A. J. Chalk et a., "Graft Polymerization of Styrene on Lithiated Poly(2,6-Dimethyl-1,4-Phenylene Ether)," J. Polym. Sci., Part A-I, vol. 7 (1969) 1359-1369.
V. L. Bell et al., "Graft Copolymers Form Poly(2,6-Dimethyl-1,4-Phenylene Oxide and Pivalolactorne," J. Polym. Sci.: Part A, vol. 26 (1988) 827-834.
A. J. Chalk et al., "Preparation of Reactions of Lithiated Poly(2-Methy-6-Phenyl-1,4-Phenylene Ether)," J. Polym. Sci., Part A-I, vol. 9 (1971) 3679-3682.
A. J. Chalk et al., "Preparation and Reactions of Lithiated Poly (2,6-Diphenyl-1,4-Phenelene Ether)," J. Polym. Sci., Part A-I, vol. 9 (1971) 3067-3069.
A. Katzfub et al., "The Application of Covalently Cross-Linked BrPPO as AEM in Alkaline DMFC," J. Membr. Sci., vol. 425-426 (2013) 131-140.
I. E. Coop et al., "The Vapor-Phase Electric Dipole Moments of Thionyl Chloride, Sulfuryl Chloride, and Dimethylsulfone, and Thiophosgene," Trans. Faraday Soc., vol. 35 (1939) 505-511.
Y. P. Egorov et al., "Study of Intramolecular Interactions in P-Substituted Aryl Trifluoromethyl Sulfones," Teoreticheskaya i Eksperimental'naya Khimiya, vol. 14 (1978) 84-90.
V. Baliah et al., "The Dipole Moments of Some Unsaturated Sulfones," Trans. Faraday Soc., vol. 55 (1959) 232-234.
Y. Ju et al., "Revisiting Nucleophilic Substitution Reactions: Microwave-Assisted Synthesis of Azides, Thiocyanates, and Sulfones in Aqueous Medium," J. Org. Chem., vol. 71 (2006) 6697-6700.
I. B. Ward et al., "Sulfinate Esters. II. The Synthetic Utility of Methyl Methanesulfinate," J. Org. Chem., vol. 32 (1967) 324-326.
Q. Chen et al., "High Field Tunneling as a Limiting Factor of Maximum Energy Density in Dielectric Energy Storage Capacitors," Appl. Phys. Lett., vol. 92 (2008) 142909.1-142909.3.
Gaylord Chemical Co., LLC, "DMSO2: Physical Properties," Bulletin #301B (2007) available at http://redireonhosting.com/~gaylordc/uploads/images/pdfs/literature/301B.pdf.
C. Xu, "Measurement of Resistive and Absorption Currents in Capacitor Films Up to Breakdown," Conf. Rec. IEEE Int. Symp Elect. Insul. (2006) 249-252.
M. H. Mittleman, "Theory of Low-Energy-Electron Scattering by Polar Molecules," Phys. Rev., vol. 140 (1965) A726-A729.
J. M. Levy-Leblond, "Electron Capture by Polar Molecules," Phys. Rev., vol. 153 (1967) 1-4.
J. M. Ugalde et al., "Bound Electronic States in a Statically Screened Electric-Dipole Potential," Phys. Rev.: A, vol. 54 (1996) 2868-2873.
S. Wu et al., "Aromatic Polythiourea Dielectrics With Ultrahigh Breakdown Field Strength, Low Dielectric Loss, and High Electric Energy Density," Adv. Mater., vol. 25 (2013) 1734-1738.
R. R. Tummala et al., "Microsystems Packaging From Milli to Microscale to Nanoscale," Proc. HDP (2004) 1-7.
G. Williams, "Chapter 20: Polymer Dynamics and Broadband Dielectric Spectroscopy," ACS Symposium Series (2005) 268-281.

* cited by examiner

POLY(2,6-DIMETHYL-1,4-PHENYLENE-OXIDE) DERIVATIVES WITH SULFONYL PENDANT GROUPS AND METHODS THEREFOR

RIGHTS OF THE GOVERNMENT

The invention described herein may be manufactured and used by or for the Government of the United States for all governmental purposes without the payment of any royalty.

FIELD OF THE INVENTION

The present invention is directed to sulfonyl-substituted poly(phenylene-ether)s having improved dielectric properties and to methods for making the same.

BACKGROUND OF THE INVENTION

High dielectric constant or permittivity, "high-k," materials have received increasing interest recently for various potential applications including high energy-density-storage capacitor, gate dielectrics, and electroactive materials. In particular, high temperature polymers (those having a melting point greater than 150° C.) with high dielectric constant and low dielectric loss are critical as embedded capacitors, which enable microelectronic-system integration to reduce size without compromising performance or, better still, with the possibility of enhanced performance in electronic systems. High-k materials suitable for some applications, such as film capacitors for power-conditioning, power electronics in hybrid electric vehicles, pulsed power, and gate dielectric field-effect transistors, must possess processability, good dielectric properties over a broad frequency range, and be thermally stable. It is conventionally believed that no single material is able to satisfy all the above-mentioned prerequisites. Therefore, recent years have witnessed an extensive exploitation of polymer-nanocomposite strategies. The overarching goal of these efforts has been to combine the best characteristics of nanofillers with polymer substrates in a synergistic fashion to improve dielectric performance of the composite materials by maximizing the dielectric constant while managing the dielectric loss to an acceptable level. From the material science standpoint, there is clearly an increasing need for high-k, nonconducting polymers (i.e., devoid of both intrinsically electronic and ionic conduction) that are processable and compatible with high-k nanoparticles.

Poly(phenylene ether)s or "PPEs" are a family of high performance thermoplastics with good high temperature properties and excellent hydrolytic stability. An important member of the PPEs family, poly(2,6-dimethyl-1,4-phenylene oxide), commonly known as PPO, is a useful material that is commercially produced on a large scale. PPO may be prepared by an oxidative coupling polymerization of 2,6-dimethylphenol as shown below:

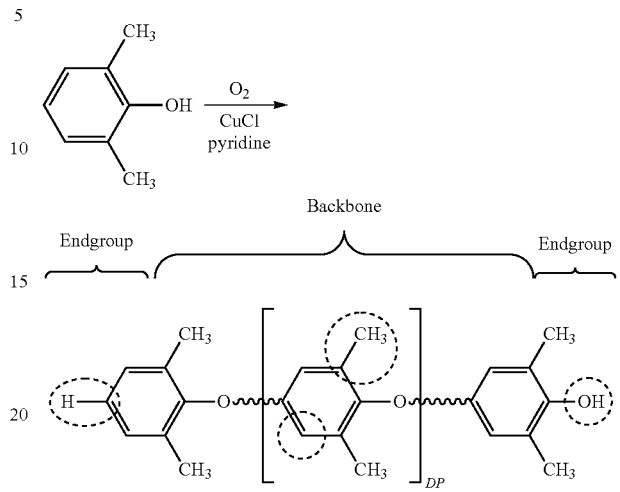

wherein DP is a degree of polymerization.

PPEs have been considered for low-k materials for the next generation of microelectronic devices because of excellent dielectric properties. For example, the dielectric constant, $\varepsilon_r$, of PPEs ranges between 2.4 and 2.6 and tan δ ranges between 0.002 and 0.003 (at 5 GHz for PPO). PPEs also have a low moisture absorption and are highly resistive to acids and bases. On the other hand, for these thermoplastics to be attractive as high-k dielectrics in semiconductor manufacturing processes and energy-density storage applications, the $\varepsilon_r$ value would need to be substantially higher (i.e., greater than 6.0) and tan δ would need to be less than 1%.

Attempts to modify PPEs to achieve the foregoing properties using conventional methods often yields undesirable cross-linking, requires a multi-step process, or both, such that conventional methods cannot be used for producing polymers having a high degree of functionality. For example, Br-PPO reacting with sodium thiomethoxide (methylthiolate) via a nucleophilic substitution reaction according to convention methods affords methylsulfido-PPO ("CH$_3$S-PPO"). Upon subsequent oxidation by m-CPBA, CH$_3$S-PPO may be quantitatively converted to the sulfonyl product, CH$_3$SO$_2$-PPO. However, under the same reaction conditions, Br-PPOs having a higher degree of Br-functionalization (greater than 25 mol %) fails to convert to the CH$_3$S-PPO product because of extensive gel formation during the reaction. While wishing to not be bound by theory, it is believed that as an effective concentration of benzylbromide in Br-PPO is increased, the CH$_3$S— pendant reacted faster than methylthiolate nucleophile with the nearby CH$_2$—Br pendant, resulting in gelation of the polymerization mixture via the formation of sulfonium salt cross-links, which is shown below:

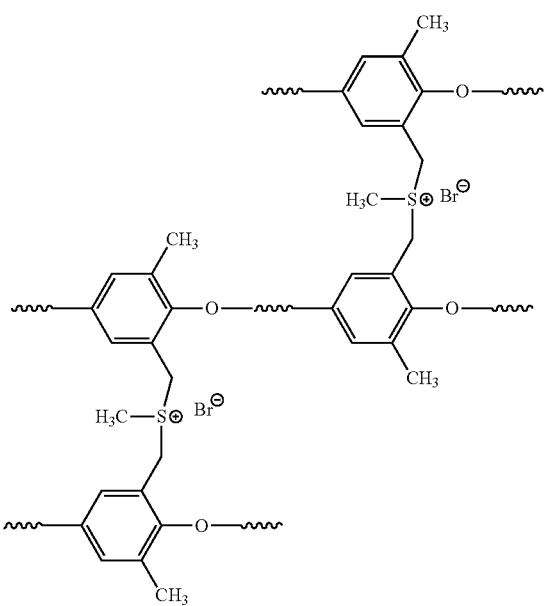

Thus, there remains a need for polymers having suitable dielectric constants that facilitate microelectronic device manufacture and operation and improved methods for making these polymers.

SUMMARY OF THE INVENTION

The present invention overcomes the foregoing problems and other shortcomings, drawbacks, and challenges of conventional PPEs by providing methods for synthesizing PPEs having higher dielectric constants and lower tan δ properties. While the invention will be described in connection with certain embodiments, it will be understood that the invention is not limited to these embodiments. To the contrary, this invention includes all alternatives, modifications, and equivalents as may be included within the spirit and scope of the present invention.

According to some embodiments of the present invention, a sulfonyl-substituted PPE having improved dielectric properties includes sulfone-containing PPO having repeating units of the formulae:

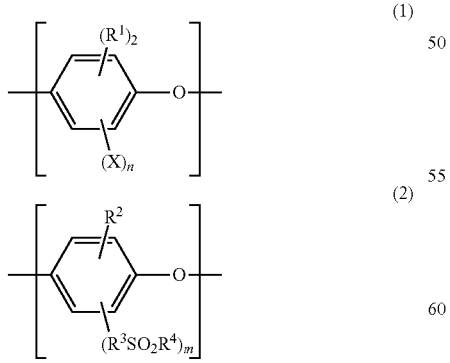

wherein each of $R^1$ and $R^2$ is H or an alkyl group containing from 1 to 4 carbon atoms, $R^3$ is an alkylene group containing from 1 or 2 carbon atoms, $R^4$ is selected from an alkyl group containing from 1 to 4 carbon atoms, an aryl group, and $CF_3$, X is a halogen atom, the subscript n is 0 or 1, the subscript m is 1 or 2 (provided that when m is 2 then $R^2$ is H), the degree of polymerization ranges from about 5 to about 1,000, and a mole ratio of units having formula (1) to units having formula (2) ranges from about 10:90 to about 90:10.

Yet other embodiments of the present invention are directed to a method for synthesizing a sulfone-containing PPO and includes reacting a di-alkyl-substituted polyphenylene oxide polymer with a halogenating agent to form a halogenated PPO containing a major amount of halogenated benzylic PPO and a minor amount of ring-substituted halogen-containing PPO. The halogenated PPO is then reacted with a sulfinating agent to provide the sulfone-containing PPO polymer.

In some embodiments of the present invention, X of structure (1) is a bromine atom.

In other embodiments, $R^1$ and $R^2$ are selected from —$CH_3$ and —$CH_2CH_3$, $R^3$ is selected from —$CH_2$— and —$CH_2CH_2$—, and $R^4$ is selected from $CF_3$ and an aryl group.

In some embodiments, the aryl group of $R^4$ contains one, two, or three substituents selected from —$CH_3$, —$OCH_3$, a dimethyl amino group, and a diethylamino group. In other embodiments, the aryl group is a para-substituted aryl group wherein the substituent is selected from a halide, —$CH_3$, —$OCH_3$, a dimethyl amino group, and a diethylamino group. In still other embodiments, the aryl group is an ortho-substituted aryl group wherein the substituent is selected from a halide, —$CH_3$, —$OCH_3$, a dimethyl amino group, and a diethylamino group. In yet other embodiments, the aryl group includes one para-group and two ortho-groups each selected from a halide, —$CH_3$, —$OCH_3$, a dimethyl amino group, and a diethylamino group.

In other embodiments, the amount of halogen-containing units in the polymer ranges from about 0.20 mol % to about 0.40 mol %.

In some embodiments, the units of formula (1) of the sulfone containing polymer include units of the formulas:

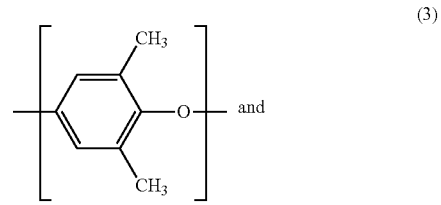

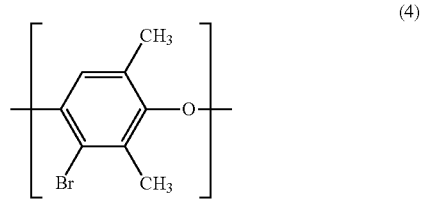

wherein a molar ratio of units of formula (3) to units of formula (4) ranges from about 64:36 to about 99:1.

In other embodiments, the units of formula (2) include units of formulas:

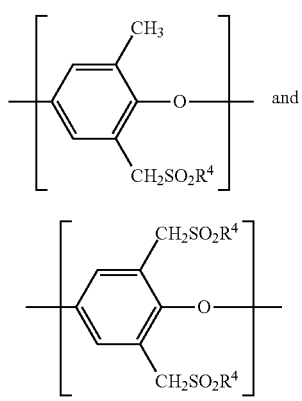

wherein a molar ratio of units of formula (5) to units of formula (6) ranges from about 1:0 to about 5:3.

In other embodiments, the halogenating agent may be selected from elemental bromine and a brominated imide compound. In some embodiments, the halogenating agent is bromo-succinimide in admixture with azo-bis(isobutyronitrile). In other embodiments, a mole ratio of di-alkyl-substituted PPO to brominating agent ranges from about 1.0:0.5 to about 1.0:3.0.

In some embodiments, the sulfinating agent is selected from sodium methane sulfinate. In other embodiments, a mole ratio of sodium methane sulfonate salt to halogenated PPO ranges from about 1.0:1.0 to about 3.0:1.0. In still other embodiments, the sulfinating agent may be selected from but not limited to, the following alkaline salts of trifluoromethanesulfinate, benzenesulfinate, 4-fluorophenylsulfinate, 4-toluenesulfinate, 4-methoxyphenylsulfinate, and 4-dimethylamino-phenylsulfinate.

Other embodiments include a method for synthesizing a sulfone-containing PPO by reacting a di-alkyl-substituted PPO with a halogenating agent to form a halogenated PPO having a halogenated benzylic PPO content and a ring-substituted halogen-containing PPO content that is less than the halogenated benzylic PPO content. The halogenated PPO content is reacted with a sulfinating agent to provide the sulfone-containing PPO, wherein the polymer includes from about 10 mol % to about 90 mol % sulfonyl groups.

According to embodiments of the present invention, compositions and methods of preparation for a series of high dielectric constant and relatively low loss derivative polymers derived from poly(2,6-dimethyl-1,4-phenylene oxide) containing variable amounts of highly polar sulfonyl pendants exemplified by methylsulfonyl ($CH_3SO_2$—), trifluoromethylsulfonyl ($CF_3SO_2$—), phenylsulfonyl ($PhSO_2$—), and 4-fluorophenylsulfonyl ($4\text{-}FC_6H_4SO_2$) moieties are described. The foregoing PPE derivatives are potentially useful as neat polymer films matrix polymers or polymer substrates for electronic applications where high permittivity and low dielectric loss are desired such as polymer photovoltaics, flexible electronics, polymer capacitors, high energy-density hybrid capacitors, and the like, as well as coatings for electromagnetic shielding applications.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1A:
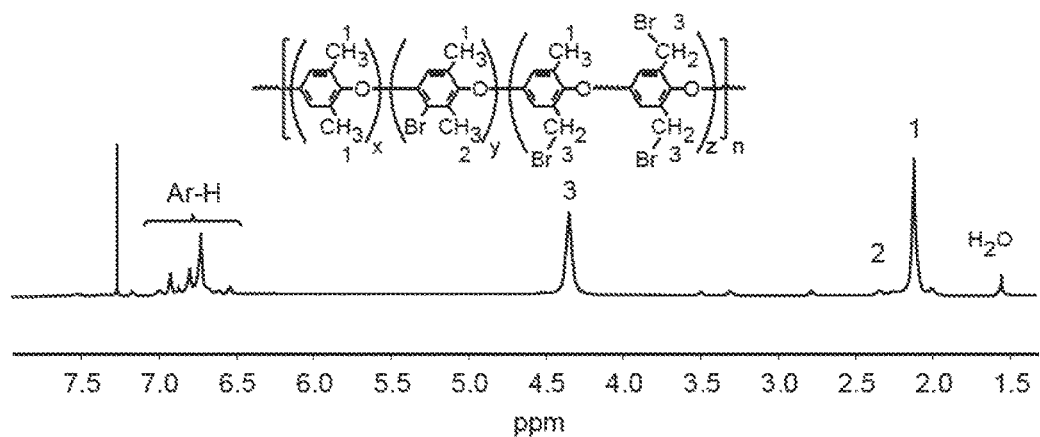
FIG. 1A is a H-NMR spectrum (taken in $CDCl_3$) of a sulfone-containing, Br-PPO synthesized in a carbon tetrachloride solvent according to embodiments of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the present invention provide sulfonyl-substituted poly(phenylene ether)s ("PPEs") having improved dielectric properties and methods of synthesizing the same. According to an exemplary embodiment, polyphenylene oxide generally, or poly(2,6-dimethyl-1,4-phenylene oxide) ("PPO") specifically, is a starting material for making the sulfonyl-substituted PPEs described herein.

As can be seen from the PPO structure, below, the nature of sites available for chemical modification, namely the polymer backbone, methyl pendant groups, and endgroups, may be considered aromatic ($sp^2C$—H), aliphatic ($sp^3C$—H), and protic (O—H), in that order.

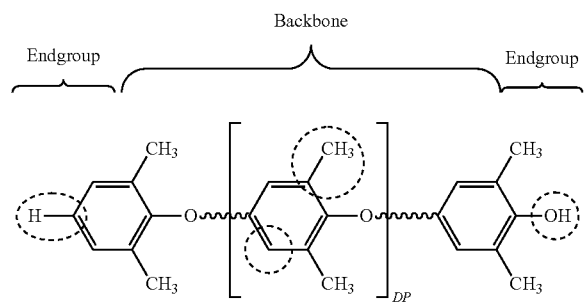

Organic and organometallic reactions may be used as specific tools to introduce functional groups into the polymer corresponding to the chemical nature of the sites. Thus, aromatic electrophilic substitution reactions (such as nitration, halogenation, Friedel-Crafts acylation and sulfonylation, and sulfonation) may be used to generate PPO derivatives with aromatic nitro, halide, or sulfonic acid, respectively. Free radical halogenation with chlorine or bromine at higher temperatures or under irradiation may be used to react with the —$CH_3$ pendant groups. The resulting PPO derivative having benzylic halogens may subsequently be reacted with a variety of N, O, S, or P nucleophiles to form neutral pendants or quarternized with tertiary amines. Metalation of alkyl substituted polyethers with organolithium compounds occurs initially on the nucleus and, on standing or at higher temperatures, transfers to the pendant alkyl group via Li—H exchange. However, with organosodium or potassium reagents, metalation occurs exclusively on the alkyl group. The metalated PPO derivatives will react as polymeric initiators for anionic polymerization of various vinyl monomers, organotrisiloxanes, and phenyl isocyantes.

According to one embodiment of the present invention, a chemical transformation may be used to structurally modify PPO, for example, radical halogenation (more specifically as applied to some embodiments, bromination) which may be the most ubiquitous method used because of the ease in operation and scalability of the reaction. The resulting halogenated PPO ("X-PPO," where X is the halogen) is a versatile intermediate for introducing a wide range of functional groups to impart desired final properties (such as chemical resistance and higher thermal stability) without the risk of molecular weight reduction and the possibility of converting the linear architecture of PPO to that of a network.

According to one specific embodiment of the present invention, PPO may be brominated with bromine in 1,1,2,2-tetrachloroethane ("TCE") and may yield two bromine atoms per repeat unit and a substantial amount of aromatic bromination:

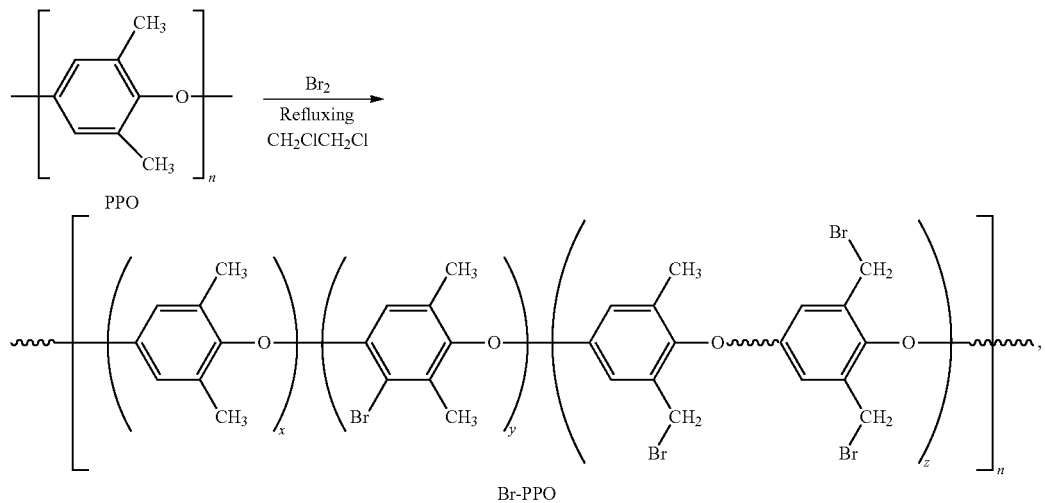

wherein x is a mole fraction of unreacted PPO units, y is a mole fraction of benzyl brominated units, z is a mole fraction of phenyl brominated units, and the subscript n is a number of repeat unites in the Br-PPO. The mole fractions of x, y, and z are such that x+y+z=1.

For synthesis of a sulfonyl-substituted PPO according to an embodiment of the present invention, halogenation may proceed with or without a suitable halogenation agent, which is, at least partially, dependent on the halogen to be introduced. In accordance with one particular embodiment of the present invention, PPO may be brominated with bromine or N-bromosuccinimide ("NBS"). Reaction parameters considered may include: (i) type of brominating reagents ($Br_2$ versus NBS/azo-2,2'-isobutyronitrile ("ARM") and NBS/benzoyl peroxide ("BPO"), (ii) a stoichiometry of the brominating agent to the repeat unit of PPO; (iii) chlorinated solvents of varied dipole moments, (iv) temperatures, and (v) reaction times. A reaction sequence with NBS/AIBN in two different solvents and at various temperatures may include:

start, there may be a nucleophilic displacement reaction with an appropriate alkylthiolate, which may then be followed by

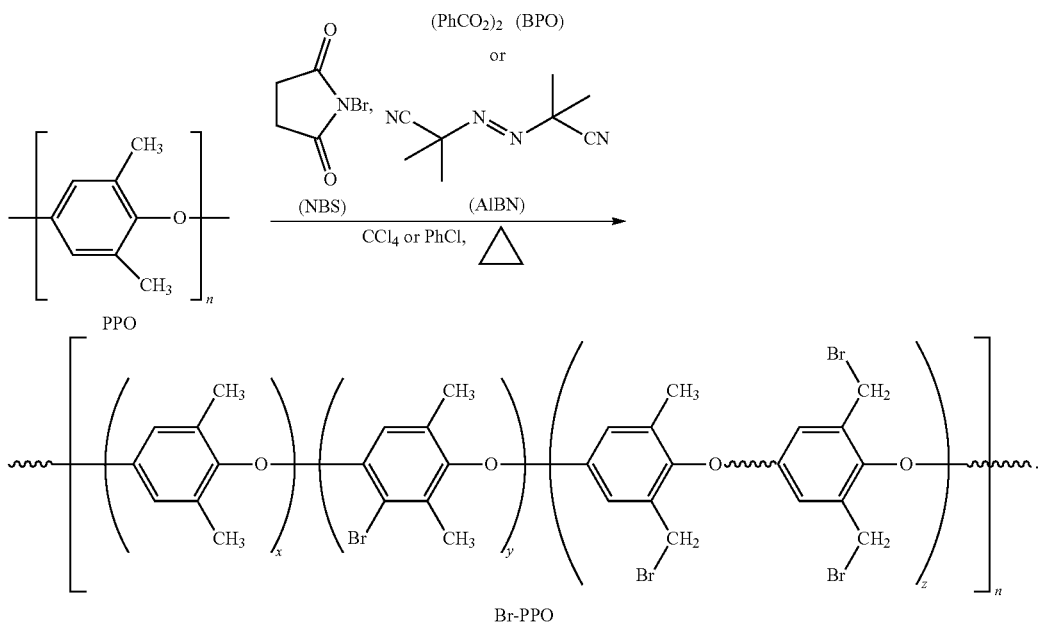

By following an appropriate combination of the reaction parameters (i)-(v), benzyl bromination ranging from 10 mol % to 80 mol %, or more, may be achieved in Br-PPO. This range of benzyl bromination may be considered as a range for the degree of functionalization resulting from the subsequent reaction to displace bromide in Br-PPO.

In order to synthesize high dielectric constant polymers, nonpolar methyl pendants may be converted to highly polar groups, such as —CH$_2$SO$_2$Me, —CH$_2$SO$_2$CF$_3$, and the like. The high polarity of the foregoing groups is expected to derive from the high polarity exhibited by the parent molecules, namely, dimethyl sulfone (CH$_3$SO$_2$Me, dipole moment, 4.44±0.1 D, gas phase; 4.25 D); methyl trifluoromethylsulfone (CH$_3$SO$_2$CF$_3$; dipole moment 3.74 D); and phenyl methyl sulfone (CH$_3$SO$_2$Ph; dipole moment 4.8 D), which are expected to contribute to the enhanced dielectric constant and acceptable dielectric loss of sulfonyl-PPO.

The PPO pendant may be converted from benzyl bromide to benzylsulfonyl ("Bz-SO$_2$R") using a two-step process. At oxidation of the sulfide intermediate to a sulfone product with an appropriate oxidizing agent (such as hydrogen peroxide, sodium periodate, m-chloroperbenzoic acid ("m-CPBA"), etc.).

To circumvent the problem of crosslinking that occurs with conventional methods, and particularly when Br-PPO has a degree of functionalization of greater than 25%, the tandem nucleophilic character of the methylsulfido pendant was eliminated by masking or blocking its second reactivity, according to a specific embodiment of the present invention. More particularly, Br-PPO may be converted to RSO$_2$-PPO by nucleophilic substitution reaction of the benzylbromo pendants of Br-PPO by sodium organosulfinate salt in a polar aprotic solvent, such as N,N'-dimethylacetamide ("DMAc"), at room temperature. Such reaction is illustrated below:

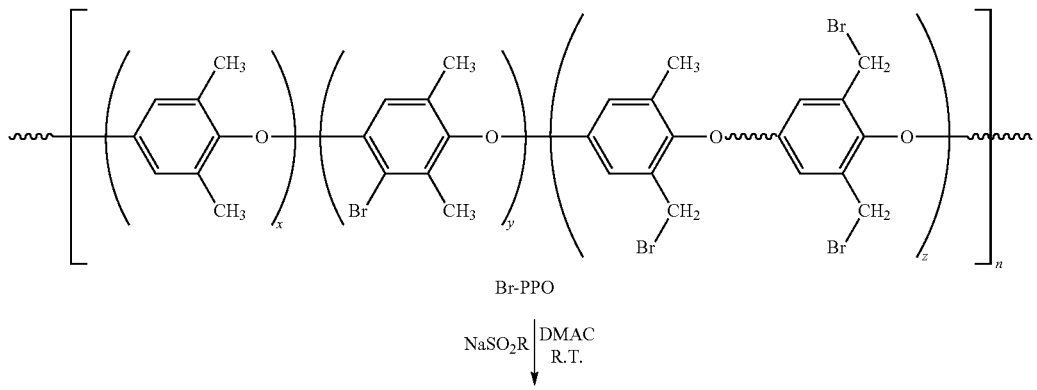

-continued

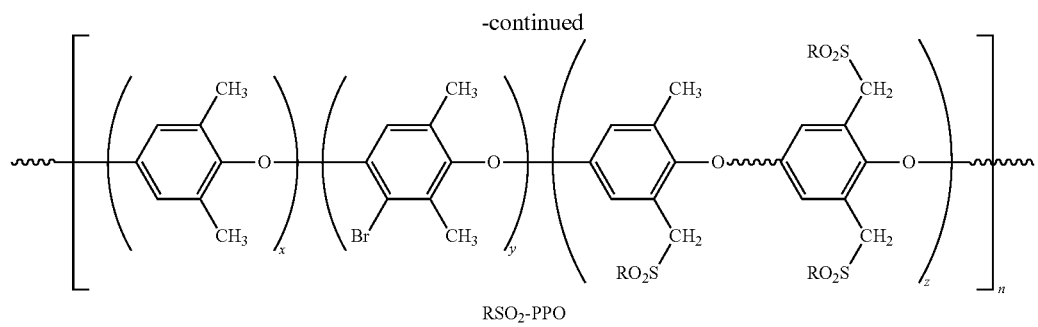

RSO₂-PPO

The illustrative method may be used to achieve any degree of RSO$_2$-functionalization ranging from about 10 mol % to about 80 mol %, or more.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1—Bromination of PPO Via NBS and AIBN (BR-PPO with 25.1 mol % Functionality)

Commercial PPO (4.80 g, 40.0 mmol) and CCl$_4$ (100 mL) were added to a 500 mL, 3-necked flask equipped with a magnetic stirrer, a nitrogen inlet, and an outlet, and stirred under dry nitrogen at 50° C. until PPO was dissolved. NBS (3.56 g, 20.0 mmol) and AIBN (0.32 g) were then placed in the flask. The mixture was heated under reflux for 1 hr. The viscous solution was diluted with CCl$_4$ and precipitated into methanol to afford white fibers, which was collected by filtration. The product was dried in an oven and provided 5.60 g (88%) of light brown fibers. The ATR-IR peak values (cm$^{-1}$) were: 3036, 2973, 2918, 2860, 1603, 1462, 1305, 1188, 1028, 986, 964, 860, 827, 637, 590, 504.

Example 2—Bromination of PPO with NBS and AIBN (BR-PPO with 33.9 mol % Functionality).

Commercial PPO (4.80 g, 40.0 mmol), CCl$_4$ (100 mL), NBS (7.12 g, 40.0 mmol), and AIBN (0.32 g) were used in a process similar to Example 1, except the mixture was heated under reflux for 2 hr. The product was dried in oven and provided 6.10 g (88%) of light brown fibers (FIG. 1A). The ATR-IR peak values (cm$^{-1}$) were: 3035, 2973, 2918, 2860, 1603, 1464, 1305, 1187, 1028, 986, 964, 860, 827, 637, 590, 504.

Example 3—Bromination of PPO with NBS and AIBN (BR-PPO with 40.7 mol % Functionality).

Commercial PPO (4.80 g, 40.0 mmol), CCl$_4$ (100 mL), NBS (7.12 g, 40.0 mmol) and AIBN (0.32 g) were used in a process similar to Example 1, except the mixture was heated under reflux for 3 hr. The yield was 6.2 g (85%). The ATR-IR peak values (cm$^{-1}$) were: 3035, 2980, 2918, 1603, 1464, 1305, 1219, 1189, 1030, 986, 862, 825, 629, 589, 503.

Anal. Calc. (%). for C$_8$H$_{7.18}$Br$_{0.82}$O: C, 51.98; H, 3.92; Br, 35.44. Found: C, 51.71; H, 3.81; Br, 35.35.

Example 4—Bromination of PPO with NBS and AIBN (BR-PPO with 52.0 mol % Functionality).

Commercial PPO (4.80 g, 40.0 mmol), CCl$_4$ (200 mL), NBS (12.82 g, 72.0 mmol), and AIBN (0.32 g) were used in a process similar to Example 3. The mixture was heated under reflux for 3 hr to provide 6.4 g (79%) of fibers. The ATR-IR peak values (cm$^{-1}$) were: 3036, 2981, 2918, 1603, 1464, 1305, 1219, 1190, 1030, 986, 862, 826, 629, 589, 503. Anal. Calc (%). for C$_8$H$_{6.94}$Br$_{1.06}$O: C, 47.14; H, 3.44; Br, 41.56. Found): C, 46.86; H, 3.21; Br, 41.72.

Example 5—Bromination of PPO with NBS and AIBN (BR-PPO)

Commercial PPO (4.80 g, 40.0 mmol), CCl$_4$ (300 mL), NBS (17.09 g, 96.0 mmol), and AIBN (0.32 g) were used in a process similar to Example 1. After the mixture was heated under reflux for 1 hr, a gel formed and became insoluble in any solvent.

Example 6—Bromination of PPO with NBS and AIBN (BR-PPO with 79.2 mol % Functionality).

Commercial PPO (4.80 g, 40.0 mmol), chlorobenzene (266 mL), NBS (16.64 g, 93.4 mmol), and AIBN (0.32 g) were used. The mixture was heated under reflux for 24 hours to provide 9.30 g (95%) of fibers. The ATR-IR peak values (cm$^{-1}$) were: 3029, 2975, 1601, 1454, 1303, 1216, 1190, 1030, 994, 865, 794, 627, 575, 509. Anal. Calc. (%) for C$_8$H$_{6.41}$Br$_{1.59}$O: C, 39.10; H, 2.64; Br, 51.72. Found: C, 39.01; H, 2.56; Br, 52.47.

Example 7—Bromination of PPO with NBS and AIBN (BR-PPO with 80.1 mol % Functionality).

Commercial PPO (4.80 g, 40.0 mmol), chlorobenzene (266 mL), NBS (21.36 g, 120 mmol), and AIBN (0.32 g) were used. The mixture was heated under reflux for 24 hr to provide 9.60 g (98%) of fibers. (Example 7 in FIG. 1B). The ATR-IR peak values (cm$^{-1}$) were: 3036, 2975, 1602, 1455, 1304, 1191, 1030, 995, 866, 793, 669, 628, 576, 509.

Example 8—Bromination of PPO with NBS and AIBN (BR-PPO with 19.2 mol % Functionality).

Commercial PPO (4.80 g, 40.0 mmol), CHCl$_3$ (100 mL), NBS (7.12 g, 40.0 mmol), and AIBN (0.32 g) were used in a process similar to Example 3. The mixture was heated under reflux for 3 hr to afford 5.3 g (82%) of fibers. The ATR-IR peak values (cm$^{-1}$) were: 3036, 2922, 2917, 1601, 1464, 1305, 1219, 1190, 1189, 1022, 986, 862, 826, 634, 586.

Example 9—Bromination of PPO with NBS and BPO (BR-PPO with 9.94 mol % Functionality).

Commercial PPO (4.80 g, 40.0 mmol), 1,2-dichloroethane (100 mL), NBS (7.12 g, 40 mmol), and benzyl peroxide (BPO) (0.48 g) were used in a process similar to Example 3. The mixture was heated at 70° C. for 3 hr to afford 5.90 g (91%) of fibers. The ATR-IR peak values (cm$^{-1}$) were: 3036, 2953, 2919, 1602, 1468, 1424, 1379, 1305, 1183, 1115, 1019, 958, 854, 825, 777, 754, 594, 563.

Example 10—Bromination of PPO with Elemental Bromine (BR-PPO with 21.9 mol % Benzylbromide).

Commercial PPO (4.80 g, 40.0 mmol) and 1,1,2,2-tetrachloroethane (100 mL) were added to a 500 mL, 3-necked flask equipped with a magnetic stirrer, a nitrogen inlet, and an outlet, and stirred under dry nitrogen at 50° C. until PPO was dissolved. Then Br$_2$ (3.52 g, 44.0 mmol) was added slowly under reflux for 3 hr. The viscous solution was precipitated into methanol to afford white fibers, which were collected by filtration. The product was dried in oven to provide 7.40 g (97%) of light brown fibers. NMR spectra is shown in FIG. 1C. The ATR-IR peak values (cm$^{-1}$) were: 3035, 2954, 2921, 1600, 1462, 1400, 1380, 1306, 1188, 1022, 986, 963, 857, 791, 670, 631, 590.

Example 11—Bromination of PPO with 37.7 mol % Benzylbromide

Commercial PPO (4.80 g, 40.0 mmol), Br$_2$ (6.40 g, 80.0 mmol), and 1,1,2,2-tetrachloroethane (100 mL) were used. The mixture was heated under refluxing for 3 hr to afford 7.4 g (96%) of light brown fibers. The ATR-IR peak values (cm$^{-1}$) were: 3035, 2954, 2921, 1600, 1462, 1400, 1380, 1306, 1188, 1022, 986, 963, 857, 791, 670, 631, 590.

Table 1, below, is a summary of the reaction conditions and results for the above bromination examples.

$$\text{Mol \% of } Methyl\text{-}Br = \frac{\text{Intergration Value of Peak 2}}{\text{Intergration Value of Peak 2} + (\text{Intergration Values of Peak 1} + 3) * \frac{2}{3}} \quad \text{Equation 1}$$

$$\text{Mol \% of } Ar\text{-}Br = \frac{(\text{Intergration Value of Peak 3}) * \frac{2}{3}}{\text{Intergration Value of Peak 2} + (\text{Intergration Values of Peak 1} + 3) * \frac{2}{3}} \quad \text{Equation 2}$$

Figure 1B:
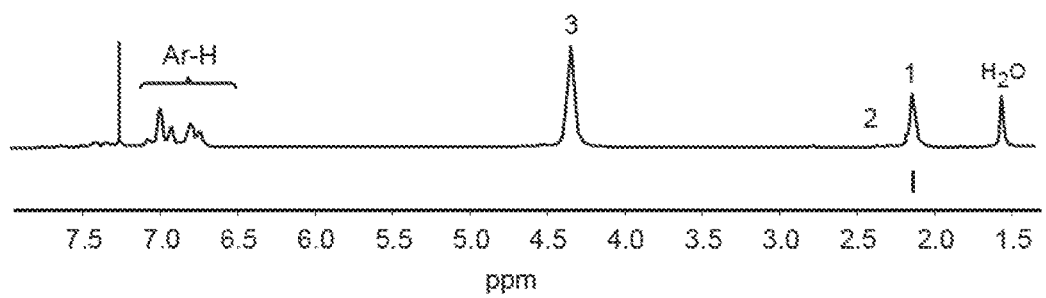
FIG. 1B is a H-NMR spectrum (taken in $CDCl_3$) of a sulfone-containing, Br-PPO synthesized in a phenyl chloride solvent according to embodiments of the present invention.
Figure 1C:
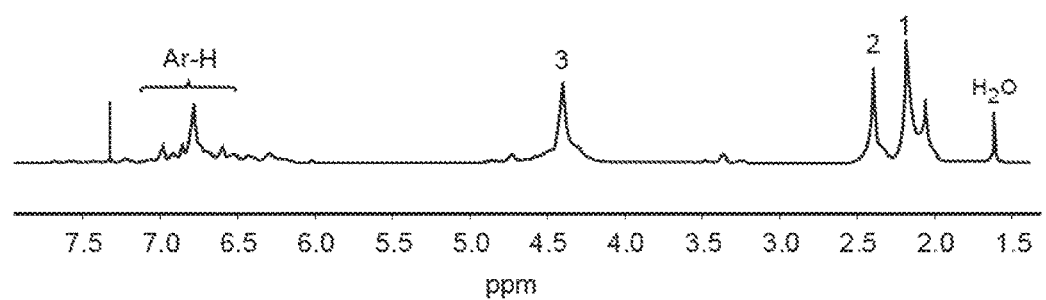
FIG. 1C is a H-NMR spectrum (taken in $CDCl_3$) of a sulfone-containing, Br-PPO synthesized in a tetrachloroethane solvent according to embodiments of the present invention.

As summarized in Table 1, above, the combination of NBS/AIBN together with nonpolar carbon tetrachloride (CCl$_4$), commonly used for allylic or benzylic bromination driven by free-radical chain process, were found to be effective in minimizing the formation of aryl bromide (Examples 1 to 4), based on the quantitative proton NMR comparison as depicted in FIGS. 1A-1C. With reference to FIGS. 1A-1C, proton-NMR spectra (CDCl$_3$) of Gr-PPO in a CCl$_4$ solvent (FIG. 1A; Example 2), Br-PPO in chlorobenzene solvent (FIG. 1B; Example 7), and Br-PPO in tetrachloroethylene solvent (FIG. 1C; Example 10) are shown. The characteristic benzylic proton signals are labeled as 1 for CH$_3$ ortho to H, 2 for CH$_3$ ortho to Br (i.e., undesired aromatic PPO repeat unit) and 3 for CH$_2$Br (i.e., the desired Br-PPO repeat unit) in FIGS. 1A-1C.

Reaction time is important and, under the conditions described above, should be conducted for no more than 3 hr. After this 3 hr reaction time, Br-PPO starts to precipitate out and form an insoluble gel if the reaction is allowed to continue after the first sign of precipitation (Example 5). Because of this constraint, the highest percentage of bromine on methyl group is 52.0 mol % when CCl$_4$ was used as the solvent. Thus, to keep the Br-PPO in solution, chlorobenzene with greater solvating power was used and, indeed, the percentage of bromine on the methyl group was raised to about 80 mol % (Examples 6 and 7).

Functionalization of Br-PPO with a polar group is illustrated by the following examples.

Example 12—Preparation of Thiomethoxide-PPO (CH$_3$S-PPO with 25.1 mol % Benzylsulfide).

Br-PPO (Example 1: 1.59 g, 10.0 mmol) and dimethylacetamide ("DMAc") (50 mL) were added to a 250 mL,

TABLE 1

PPO BROMINATION CONDITIONS AND PERCENTAGE OF BR-PPO PRODUCTS

| Example No. | Bromination Reagent | Molar Ratio[1] | Reaction Solvent | Reaction Temp. (° C.) | Reaction Time (hr) | Mol % of Methyl-Br[2] | Mol % of Aryl-Br[2] | Mol % Unreacted PPO |
|---|---|---|---|---|---|---|---|---|
| 1 | NBS/AIBN | 1:0.5 | CCl$_4$ | 88 | 2 | 25.1 | 0.24 | 74.7 |
| 2 | NBS/AIBN | 1:1 | CCl$_4$ | 88 | 2 | 33.9 | 0.45 | 65.7 |
| 3 | NBS/AIBN | 1:1 | CCl$_4$ | 88 | 3 | 40.7 | 0.62 | 58.7 |
| 4 | NBS/AIBN | 1:1.8 | CCl$_4$ | 88 | 3 | 52.0 | 1.60 | 46.4 |
| 5 | NBS/AIBN | 1:2.4 | CCl$_4$ | 88 | 1 | [3] | [3] | [3] |
| 6 | NBS/AIBN | 1:2.33 | Chlorobenzene | 145 | 24 | 79.2 | 0.45 | 20.4 |
| 7 | NBS/AIBN | 1:3 | Chlorobenzene | 145 | 24 | 80.1 | 0.42 | 19.5 |
| 8 | NBS/AIBN | 1:1 | CHCl$_3$ | 80 | 3 | 19.2 | 6.67 | 74.1 |
| 9 | NBS/BPO | 1:1 | CH$_2$ClCH$_2$Cl | 70 | 3 | 9.94 | 32.3 | 57.8 |
| 10 | Br$_2$ | 1:1.1 | CHCl$_2$CHCl$_2$ | 130 | 3 | 21.9 | 13.6 | 64.5 |
| 11 | Br$_2$ | 1:2 | CHCl$_2$CHCl$_2$ | 130 | 3 | 37.7 | 16.3 | 46.0 | wherein [1]the molar ratio is bromination agent to PPO, [2]the mol % of Methyl-Br and mol % of Aryl-Br were calculated from NMR spectra (FIGS. 1A-1C) and in accordance with the Equations 1 and 2 (below), and [3] gelation occurred in 1 hr and the product became insoluble in any solvent.

3-necked flask equipped with a magnetic stirrer, a nitrogen inlet, and an outlet, and stirred under dry nitrogen at room temperature until Br-PPO was dissolved to form a yellow solution. Then, the sodium salt of methane sulfinic acid (0.35 g, 5.0 mmol) was added slowly. The mixture was agitated overnight at room temperature and poured into methanol. The white powder was collected by filtration and dried in an oven to afford 1.34 g (94%) of product. The ATR-IR peak values (cm$^{-1}$) were: 2982, 2971, 2917, 1598, 1460, 1420, 1397, 1381, 1304, 1183, 1021, 992, 958, 852.

Example 13—Preparation of Methylsulfonyl-PPO ($CH_3SO_2$-PPO with 25.1 mol % Functionality).

Oxidation of methylsulfide pendants by meta-chloroperoxybenzoic acid: $CH_3S$-PPO (Example 12: 1.0 g, 7.0 mmol) and $CHCl_3$ (40 mL) were added to a 100 mL, 3-necked flask equipped with a magnetic stirrer, a nitrogen inlet, and an outlet, and stirred under dry nitrogen at room temperature until Br-PPO was dissolved. Then the flask was cooled to 0° C. and meta-chloroperoxybenzoic acid (mCPBA, 1.8 g, 8.0 mmol) was added slowly. After the addition of mCPBA, a temperature of the reaction mixture was allowed to rise to room temperature for 2 hr, and the mixture was precipitated into methanol. The white precipitate was collected and dried in a vacuum oven to provide 0.94 g (84%) of product. The ATR-IR peak values (cm$^{-1}$) were: 2981, 2929, 2886, 1600, 1462, 1422, 1398, 1382, 1303, 1251, 1186, 1158, 1118, 1022, 989, 959, 887, 857, 752, 527, 491, 449.

For the direct substitution of benzylbromide pendants by methanesulfinate nucleophile, Br-PPO (Example 1; 1.50 g, 9.40 mmol) and DMAc (20 mL) were added to a 100 mL, 3-necked flask equipped with a magnetic stirrer, a nitrogen inlet, and an outlet, and stirred under dry nitrogen at room temperature until Br-PPO was dissolved. Then sodium methanesulfinate (0.75 g, 7.3 mmol) was added to the mixture in the flask. The mixture was agitated overnight at room temperature and poured into water/methanol co-solvent (1:1). The off-white solid was collected by filtration and dried in a vacuum oven to provide 1.38 g (92%) of product. The ATR-IR peak values (cm$^{-1}$) were: 2981, 2929, 2886, 1600, 1462, 1422, 1398, 1382, 1303, 1251, 1186, 1158, 1118, 1022, 989, 959, 887, 857, 752, 527, 491, 449.

Example 14—Preparation of Thiomethoxide-PPO ($CH_3S$-PPO with 33.9 mol % Functionality).

Following the procedure described in Example 12, Br-PPO (Example 2; 1.73 g, 10.0 mmol), methane sodium thiomethoxide (0.45 g, 6.4 mmol), and DMAc (50 mL) were used. Gelation occurred overnight.

The foregoing Examples 12 and 13 demonstrate a two-step process for preparing methylsulfonyl-PPO having at least 25.1 mol % benzylsulfide. However, as shown in Example 14, for benzylsulfide functionality above 25 mol %, crosslinking and gelation occur. To circumvent the problem of crosslinking associated with the conventional methods, the nucleophilic character of the methylsulfido pendant was eliminated by masking or blocking its reactivity. Because organic sulfinate salts (e.g., $RSO_2^-Na^+$) react easily with alkyl or benzyl halides; the benzyl-sulfonyl product was preferably achieved by directly converting benzyl bromide to benzylsulfone by the following reaction:

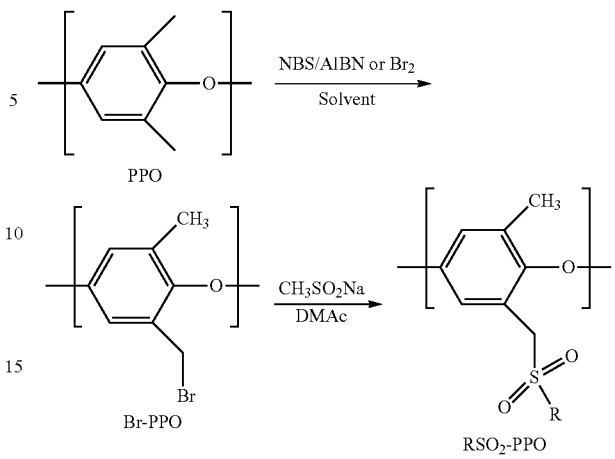

wherein R is selected from the group consisting of —$CH_3$, —$CF_3$, —$C_6H_5$, —$C_6H_4CH_3$, and —$C_6H_4F$, as illustrated, below, in Examples 15-20.

Example 15—Preparation of Methylsulfonyl-PPO ($CH_3SO_2$-PPO with 50 mol % Functionality).

Br-PPO (Example 4; 0.50 g, 2.5 mmol) and DMAc (20 mL) were added to a 100 mL, 3-necked flask equipped with a magnetic stirrer, a nitrogen inlet, and an outlet, and stirred under dry nitrogen at room temperature until Br-PPO was dissolved. Sodium methanesulfinate (0.32 g, 2.7 mmol) was added to the mixture in the flask. After the mixture was agitated at room temperature overnight it was poured into water/methanol co-solvent (1:1). The brown solid was collected by filtration and dried in a vacuum oven to provide 0.41 g (82%) of product. The ATR-IR peak values (cm$^{-1}$) were: 3015, 2930, 1602, 1464, 1301, 1248, 1192, 1160, 1118, 1030, 989, 963, 897, 757, 491, 450.

Example 16—Methylsulfonyl-PPO ($CH_3SO_2$-PPO with 80 mol % Functionality, 4-3).

Br-PPO (Example 7; 0.50 g, 2.0 mmol), sodium methanesulfinate (0.64 g, 5.4 mmol), and DMAc (20 mL) were used in a process similar to Example 15 to provide 0.46 g (92%) of a brown powder. The ATR-IR peak values (cm$^{-1}$) were: 2981, 2930, 1602, 1460, 1405, 1293, 1250, 1194, 1157, 1114, 991, 961, 884, 756, 685, 448.

Example 17—Trifluoromethylsulfonyl-PPO ($CF_3SO_2$-PPO with 50 mol % Functionality)

Br-PPO (Example 4; 0.50 g, 2.5 mmol), sodium trifluoromethanesulfinate (0.50 g, 3.2 mmol), and DMAc (20 mL) were used in a process similar to Example 15 to provide 0.62 g (98%) of a light-yellow powder. The ATR-IR peak values (cm$^{-1}$) were: 2937, 1605, 1369, 1307, 1196, 1119, 1030, 988, 870, 769, 729.

Example 18—Benzenesulfonyl-PPO ($C_6H_5SO_2$-PPO with 50 mol % Functionality)

Br-PPO (Example 4; 0.50 g, 2.5 mmol), sodium benzenesulfonate (0.85 g, 5.2 mmol), and DMAc (20 mL) were used in a process similar to Example 15 to provide 0.63 g (97%) of a light-yellow powder. ATR-IR peak values (cm$^{-1}$) were: 3063, 1606, 1466, 1448, 1307, 1194, 1156, 1132, 1085, 1028, 988, 877, 737.

Example 19—4-Toluenesulfonyl-PPO (P-MEC$_6$H$_4$SO$_2$-PPO (with 50 mol % Functionality)

Br-PPO (Example 4; 0.50 g, 2.5 mmol), sodium 4-toluenesulfonate (0.85 g, 4.4 mmol), and DMAc (20 mL) were used in a process similar to Example 15 to provide 0.70 g (100%) of a light-yellow powder. The ATR-IR peak values (cm$^{-1}$) were: 2926, 1600, 1465, 1319, 1303, 1245, 1194, 1156, 1132, 1087, 1031, 988, 870, 816, 734.

Example 20—4-Fluorobenzenesulfonyl-PPO (4-FC$_6$H$_5$SO$_2$-PPO with 50 mol % Functionality)

Br-PPO (Example 4; 0.50 g, 2.5 mmol), sodium 4-fluorobenzenesulfonate (0.90 g, 4.9 mmol), and DMAc (20 mL) were used in a process similar to Example 15 to provide 0.63 g (91%) of an off-white powder. The ATR-IR peak values (cm$^{-1}$) were: 3074, 2928, 1591, 1493, 1466, 1405, 1322, 1292, 1235, 1194, 1152, 1086, 1031, 988, 839, 820, 740.

Figure 2A:
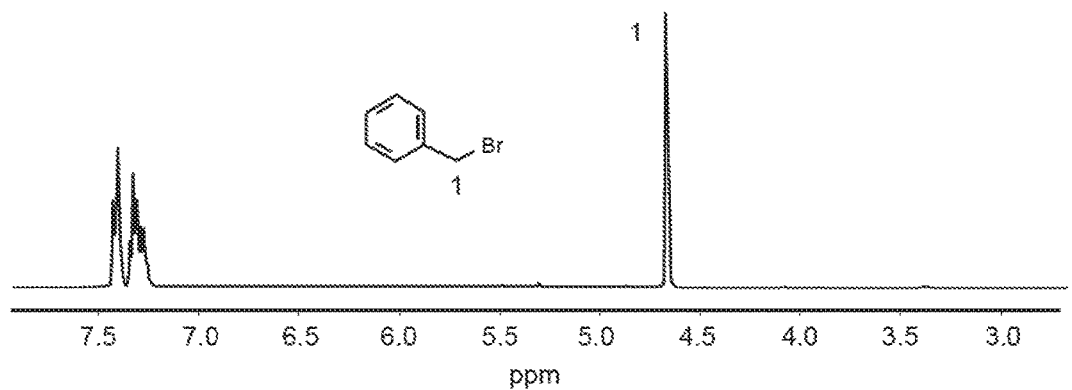
FIG. 2A is a H-NMR spectrum of sulfone-containing PPO in a reaction mixture of benzyl bromide, wherein signals denoted with an asterisk, *, are due to protio residues of deuterated dimethyl sulfoxide ("DMSO-$d_6$").
Figure 2B:
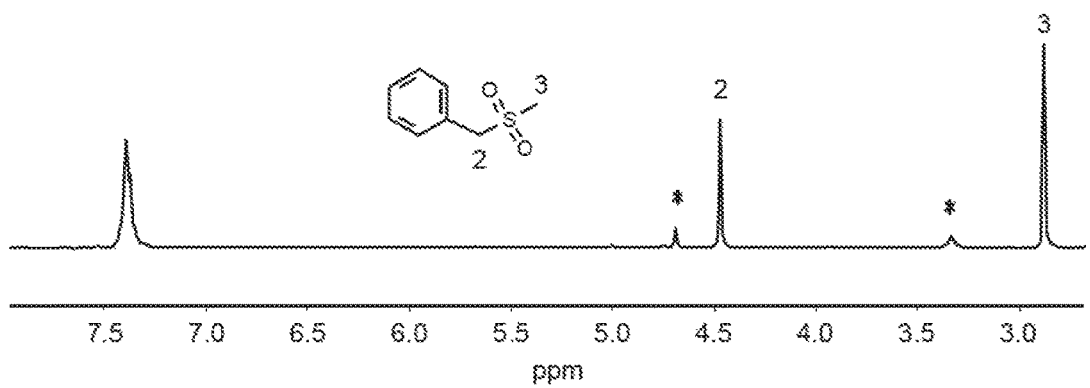
FIG. 2B is a H-NMR spectrum of sulfone-containing PPO in a reaction mixture of benzyl bromide and (methylsulfonylmethyl)benzene, wherein signals denoted by * are due to protio residues of DMSO-$d_6$.

In order to confirm the feasibility of the procedure used in Examples 15 and 16, a proton NMR spectrum of a model compound was obtained. The benzyl bromide was treated with sodium methanesulfinate (MeSO$_2$Na) at room temperature in DMSO. An instantaneous and clean reaction to produce (methylsulfonylmethyl)benzene was observed. The proton NMR spectrum of the reaction mixture, shown in FIG. 2B, indicates the complete disappearance of the starting benzyl bromide benzyl proton signal, the concomitant appearance of benzyl proton signal of the sulfone product at lower chemical shift, and a new —CH$_3$ peak. Referring to FIGS. 2A-2B, the spectra of benzyl bromide and reaction mixture of benzyl bromide (FIG. 2A) and methylsulfonylmethyl)benzene (FIG. 2B) are shown. Benzyl bromide was converted into (methylsulfonylmethyl)benzene at room temperature in DMSO-d$_6$. A small amount of benzyl alcohol (—CH2- at d 3.35 and OH at d 4.70, denoted by *) was also formed from the reaction of excess benzyl bromide with water present in DMSO-d$_6$.

Figure 3A:
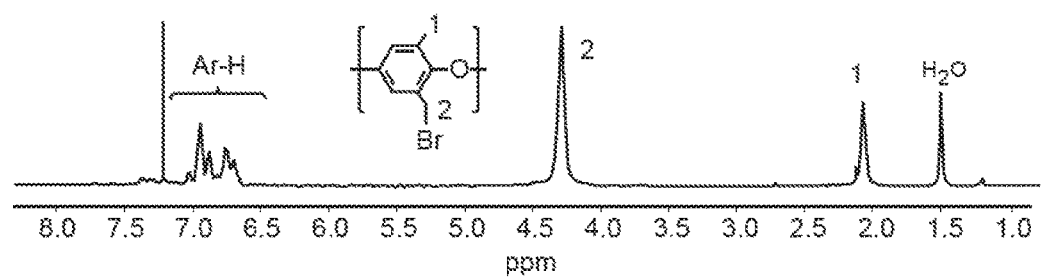
FIGS. 3A-3C are H-NMR spectra of Br-PPO, $CH_3S$-PPO, and $CH_3SO_2$-PPO in DMSO-$d_6$, respectively.
Figure 3B:
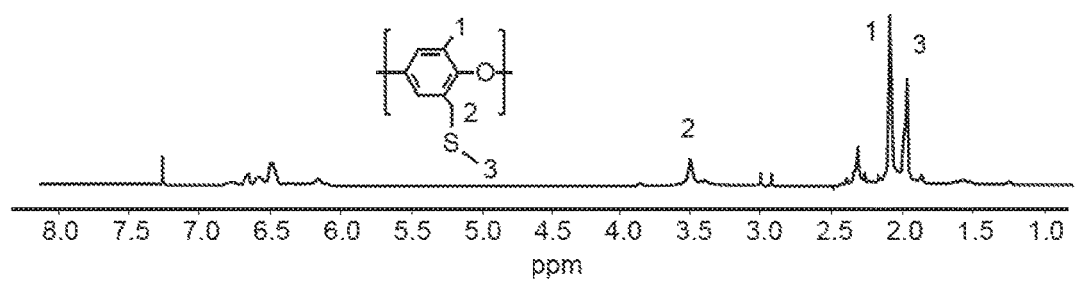
Figure 3C:
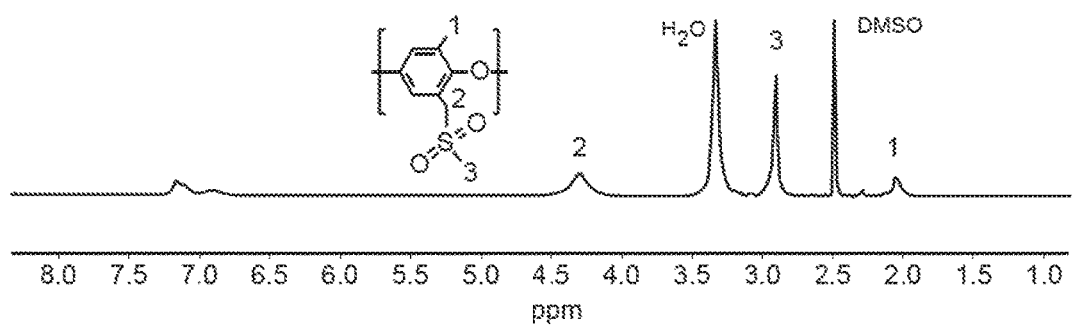

Thus, in the similar reaction, chemically modified PPO with a content up to 80 mol % has been successfully prepared by treating Br-PPO with sodium methanesulfinate using DMAc as a solvent. As shown in FIGS. 3A-3C, the comparison of the proton NMR spectra of the starting Br-PPO and the isolated CH$_3$SO$_2$-PPO, together with the characteristic NMR signals associated with benzyl bromide and benzylmethylsulfone, has validated the quantitative yield of sulfonyl-PPO. Further, this synthetic method can be extended to RSO$_2$Na with R other than methyl, especially R=CF$_3$ and 4-substituted phenylene (4-XC$_6$H$_4$—) for high permittivity PPO. FIGS. 3A-3C provide the H-NMR spectra of Br-PPO (FIG. 3A, spectrum taking in CDCl$_3$; Example 7), CH$_3$S-PPO (FIG. 3B, spectrum taking in CDCl$_3$; Examples 12 and 13), and CH$_3$SO$_2$-PPO (FIG. 3C, spectrum taking in DMSO-d$_6$; Example 16). Both Br-PPO and CH$_3$SO$_2$-PPO had the degree of functionalization of 80 mol %. CH$_3$S-PPO had the degree of functionalization of 25 mol %.

All of the polymers described herein Example 20, except CH$_3$SO$_2$-PPO containing 80 mol % functionality, are soluble in CHCl$_3$, chlorobenzene, tetrahydrofuran ("THF"), DMAc and DMSO. Highly polar CH$_3$SO$_2$-PPO containing 80 mol % functionality becomes insoluble in solvents with lower polarity, such as CHCl$_3$.

The molecular weight and polydispersity ("PDI") of the PPO described above were measured by gel-permeation chromatography ("GPC") in THF at 30° C. with a polystyrene standard. A commercially-available PPO sample exhibited comparable GPC results to a high molecular weight PPO sample (HMW PPO) (Table 2). However, Br-PPO and CH$_3$S-PPO polymers exhibited exceptionally high molecular weights (one order of magnitude higher than the unmodified PPO) and narrow PDIs (decreasing from 3 to less than 2), which indicates a likelihood that the polymers aggregated in THF solution. The molecular weight of CH$_3$SO$_2$-PPO was only slightly higher than PPO, as shown in Table 2.

TABLE 2

PPO MOLECULAR WEIGHTS AND POLYDISPERSITY

| Sample No | Sample Name | $M_n$ | $M_w$ | PDI |
|---|---|---|---|---|
| Commercial PPO-1 | PPO-1 | 36,500 | 112,000 | 3.06 |
| Commercial PPO-2 | PPO-2 | 21,700 | 68,600 | 3.20 |
| Example 2 | Br-PPO (34 mol %) | 240,000 | 333,000 | 1.39 |
| Example 4 | Br-PPO (52 mol %) | 338,000 | 466,000 | 1.38 |
| Example 6 | Br-PPO (79 mol %) | 210,000 | 304,000 | 1.52 |
| Example 12 | CH$_3$S-PPO (25 mol %) | 254,000 | 469,000 | 1.84 |
| Example 13 | CH$_3$SO$_2$-PPO (25 mol %) | 247,000 | 472,000 | 1.91 |
| Example 16 | CH$_3$S-PPO (80 mol %) | 61,200 | 120,000 | 1.96 |

The commercially-available PPO possessed a glass transition temperature ("T$_g$") at 212° C. and good thermal stability under inert atmosphere. Incorporation of bromine (less than 52 mol %) and thiomethoxide resulted in a decrease in the glass transition temperature, Br-PPO and CH$_3$SO$_2$-PPO, respectively since the modified side groups would increase the free volume and impart plasticizing effect. The T$_g$ of Br-PPO containing 80 mol % of functionality increased to 250° C. since the bulky bromide groups prevent the PPO main chains from rotating freely. T$_g$ values for CH$_3$SO$_2$-PPOs were equal to or higher than T$_g$ values of PPO due to the high polarity of side chains, and the thermally stabilities of all were all substantially reduced. A summary of the thermal properties of the PPO is provided in Table 3.

TABLE 3

THERMAL PROPERTIES OF PPO AND ITS DERIVATIVES

| Example No. | Sample Name | Tg[1] (° C.) | T$_{d5\%}$[2] (° C.) in air | T$_{d5\%}$[2] (° C.) in nitrogen |
|---|---|---|---|---|
| Commercial PPO-2 | PPO-2 | 212 | 390 | 423 |
| 1 | Br-PPO | 208 | 281 | 285 |
| 2 | Br-PPO | 204 | 277 | 277 |
| 4 | Br-PPO | 201 | 268 | 270 |
| 6 | Br-PPO | 250 | 248 | 234 |
| 12 | CH$_3$S-PPO (25 mol %)[3] | 181 | 283 | 287 |
| 13 | CH$_3$SO$_2$-PPO (25 mol %)[4] | 211 | 332 | 339 |
| 15 | CH$_3$SO$_2$-PPO (50 mol %)[5] | 228 | 327 | 336 |
| 16 | CH$_3$SO$_2$-PPO (80 mol %)[5] | 262 | 331 | 340 | wherein [1]T$_g$ was measured from mid-point of change in slope on DSC thermogram obtained with a heating rate of 10° C./min,
[2]temperature at which 5% weight loss recorded on TGA thermogram obtained with a heating rate of 10° C./min,
[3]prepared from Br-PPO (Example 1),
[4]prepared from CH$_3$S-PPO (Example 12) via m-CPBA oxidation and nearly identical thermal properties were observed for CH$_3$SO$_2$-PPO prepared by nucleophilic substitution of Br-PPO (25 mol %) with sodium methanesulfinate, and
[5]prepared from the respective Br-PPO via nucleophilic substitution with sodium methanesulfinate.

In order to evaluate the suitability of the RSO$_2$-PPO films for use as high energy density capacitors, the dielectric properties of the films were determined using broadband dielectric spectroscopy ("BDS") and dielectric displacement-electric field (D-E) loop measurements. BDS measurements of the γ transition reveal how much dipole switching contributes to the dielectric constant. Dipole switching only becomes active at and above the γ transition temperature. D-E loop measurements were used to investigate the high field performance of the CH$_3$SO$_2$-PPO films, to measure the dielectric constant at high field strengths, to estimate lossiness of the material based on the hysteresis, and to determine the breakdown strength. Discharge energy and efficiency were determined from D-E loop data.

In order to determine the dielectric properties of the polymer samples, the samples were dried in a vacuum oven for 24 hr at 130° C. The samples were then silver coated (100 nm), on both sides, by physical vapor deposition to improve electrical contact. The coated samples were kept in a desiccator filled with desiccant until measurements were performed.

BDS measurements were carried out on a broadband dielectric spectrometer. Prior to measurements, a 38 μm thick film was coated, on both sides, with 200 nm thin layers of aluminum and silver to improve electrical contact. The temperature of the sample was programmed to change linearly –140° C. to 150° C., at a rate of 2° C./min. The BDS spectrometer applied a set of sinusoidal voltages of 1 V rms from 10$^7$ Hz to 1 Hz across a sample film every 14 sec during the temperature ramping and recorded the resulting current. Similarly, the aluminum-coated sample films were used in D-E loop measurements performed at 23° C., 100° C., and 190° C. The D-E loops were measured with a ferroelectric analyzer by applying two consecutive sine waves of equal amplitudes and each of 1000 Hz to the sample. The peak amplitude of the voltage was increased every two cycles beginning from field strengths of 50 MV/m and with 316 MV/m. The results of the dielectric measurements are summarized and compared with a current standard for polymer dielectrics, i.e., biaxially oriented polypropylene ("BOPP") in Table 4.

TABLE 4

| Sample ID | $\epsilon_r'$ (1 kHz, 25° C.) | $\epsilon_r''$ (1 kHz, 25° C.) | tan δ (1 kHz, 25° C.) | Released Energy Density (J/cm$^2$) | Maxima Breakdown Field Strength (MV/m) |
|---|---|---|---|---|---|
| BOPP | 2.2 | | 0.0002 | 4.8 | 730 |
| PPO | 2.7-2.8 | <0.028 | <0.001 | | |
| PPO-SMe 25 mol % | 3.5 | 0.01 | 0.0028 | * | * |
| PPO-SO$_2$Me (25 mol %) | 6.0 | 0.06 | 0.008 | 30 (at 200 MV/m) | 900 |
| PPO-SO$_2$Me (50 mol %) | 8.0 | 0.065 | 0.008 | 28 (at 240 MV/m) | 800 |
| PPO-SO$_2$Me (80 mol %) | ~8.0* | * | * | * | * | wherein an asterisk, *, indicates poor film quality.

Figure 4A:
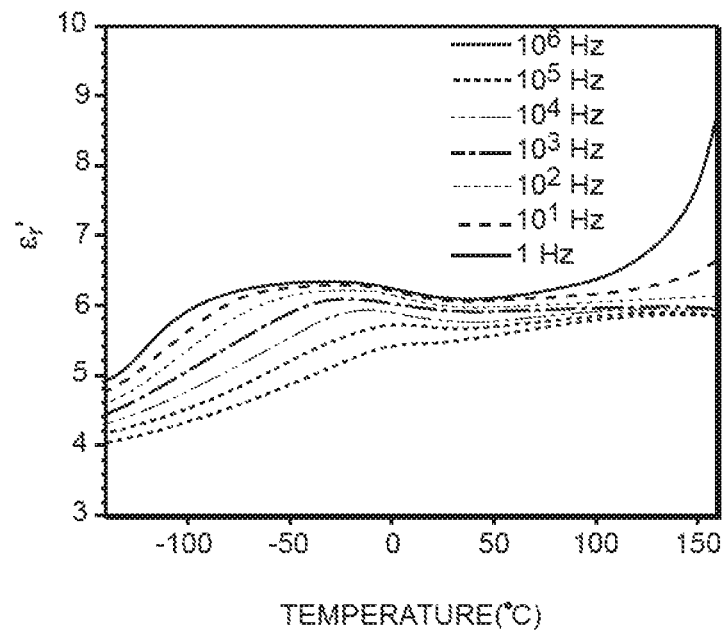
FIG. 4A graphically illustrates temperature-dependent effects on a dielectric constant for 25 mol % $CH_3SO_2$-PPO film prepared in accordance with an embodiment of the present invention.
Figure 4B:
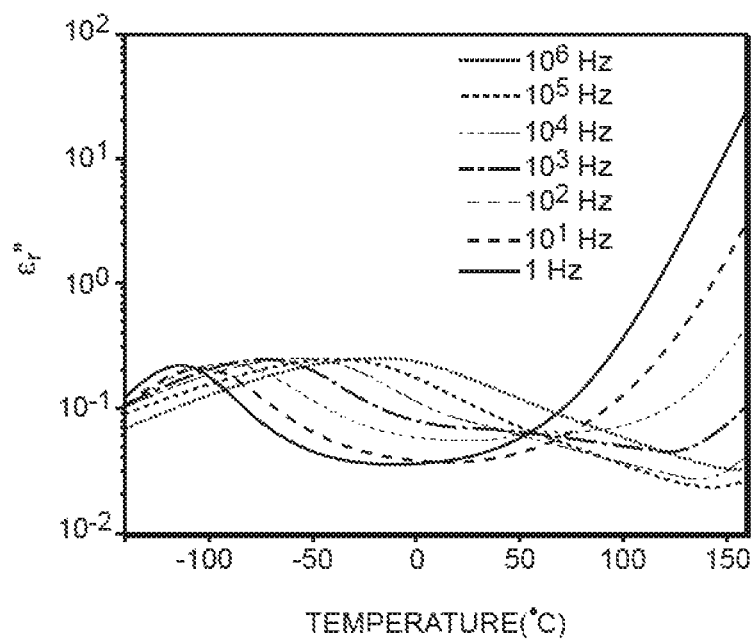
FIG. 4B graphically illustrates temperature-dependent effects on dielectric loss for 25 mol % $CH_3SO_2$-PPO film prepared in accordance with an embodiment of the present invention FIGS. 5A-5B graphically illustrate a D-E hysteresis loop for the 25 mol % $CH_3SO_2$-PPO film of FIGS. 4A and 4B.

FIGS. 4A and 4B include present BDS spectra of real $\epsilon_r'$ and imaginary $\epsilon_r''$ parts of permittivity as a function of temperature at different frequencies for 25 mol % CH$_3$SO$_2$-PPO (Example 13). One obvious transition could be identified between –140 and 150° C. with an electric field at 100 Hz, that is, at about –90° C. Above –90° C., $\epsilon_r'$ reached a peak value of 6.0. The foregoing transition may be assigned as a γ transition resulting from the rotation of the sulfone groups, which can not only increase dielectric constant, but also maintain a dielectric loss as low as $\epsilon_r''$=0.02. There was a slight decrease in $\epsilon_r'$ starting from about 0° C. The slight decrease in $\epsilon_r'$ may be due to the fact that as temperature increases, dipoles gained more thermal energy and the amplitude of random thermal motion increases, which reduces orientational polarization to some extent. With temperature increasing to around 70° C., a weak transition was observed in the spectrum of FIG. 4B, which may be assigned as a weak β transition associated with the waggling of ether groups along a polymer backbone. When temperatures reached above 100° C., $\epsilon_r''$ started to increase, likely resulting from a combination of dissipation caused by absorbed moisture and impurity ions in the polymer matrix. While even 25 mol % CH$_3$SO$_2$-PPO (Example 13) demonstrated strong dipoles, CH$_3$SO$_2$-PPO was not sensitive to moisture and was capable of keeping a low dielectric loss up to 150° C. These properties are very attractive for practical dielectric applications.

Figure 5A:
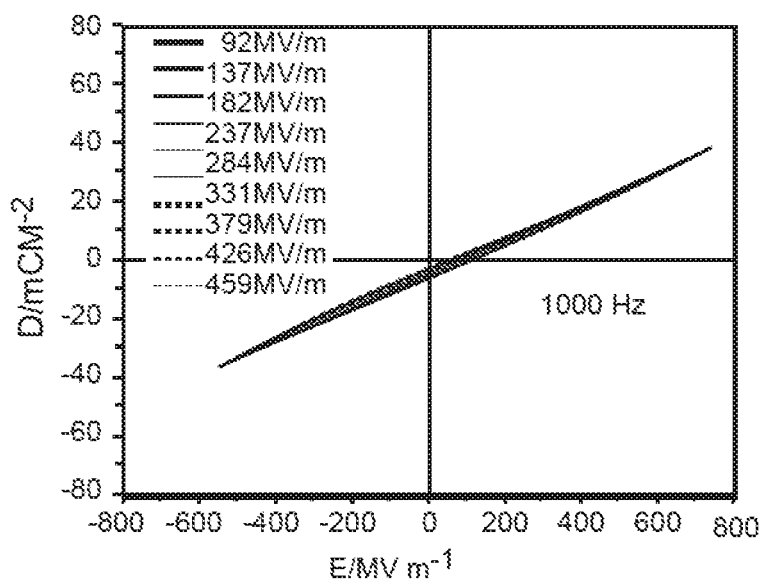

High-field dielectric properties were explored by D-E hysteresis loop measurements. At room temperature and at 1000 Hz, 25 mol % CH$_3$SO$_2$-PPO (Example 13) exhibited narrow bipolar linear loops at different electric fields ranging from 105 MV/m to 650 MV/m, as shown in FIG. 5A. The apparent k was determined to be 6.2 via k=D/(e$_0$E), which was consistent with the result obtained from BDS data. The linear nature of the loops suggests that sulfonyl groups rotated easily without dipole coupling under a high electric field. When the electric field was further increased, such as to 800 MV/m, dielectric loss became noticeable (measured by the enclosed area inside the unipolar loops in FIG. 5B). The degree of dielectric loss increased with field because of either increased ionic conduction or electronic conduction at high field. At the highest testing field (25 mol %), the dielectric of CH$_3$SO$_2$-PPO (Example 13) reached as high as 913 MV/m, above which breakdown occurred. Such high breakdown strength may be attributed to: (1) the rigid PPO backbone containing aromatic rings suppressed segmental motion and thus weakened charge hopping or tunneling under a high electric field; (2) the coulombic interaction between dipoles and charge carriers caused extra scattering in addition to phonon-electron scattering, which reduced the conduction current and prevented dielectric breakdown by stabilizing the electron energy; (3) the polar groups served as traps of charge carriers; and (4) a uniform film with a smooth film surface lowers surface-defects levels.

Figure 5B:
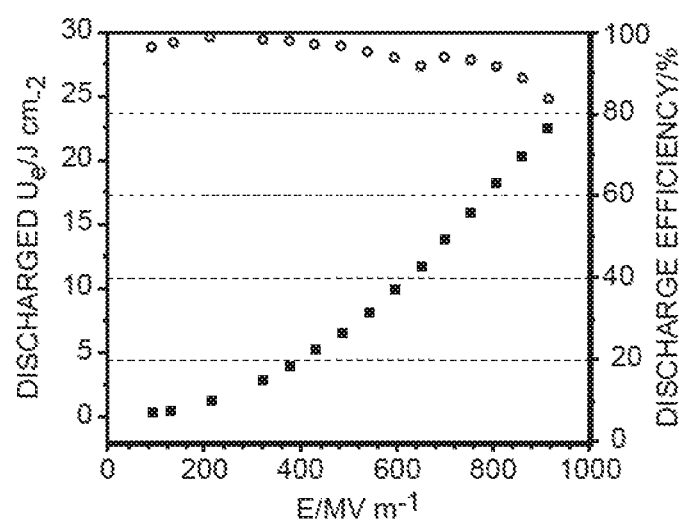
Figure 6A:
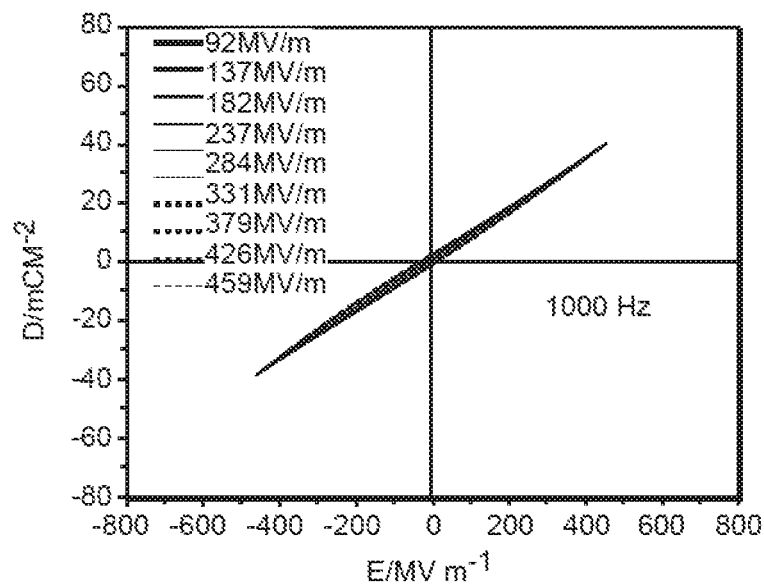
FIGS. 6A-6B graphically illustrate a D-E hysteresis loop for 50 mol % $CH_3SO_2$-PPO film prepared in accordance with an embodiment of the present invention.
Figure 6B:
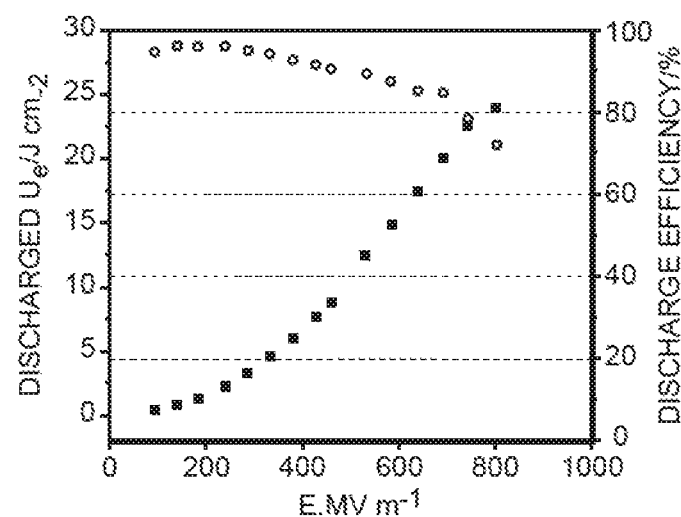

The discharge energy density (U$_{e,discharged}$) and discharge efficiency were calculated from the electric displacement-electric field (D-E) loops and the plots for 25 mol % CH$_3$SO$_2$-PPO (Example 13) and 50 mol % CH$_3$SO$_2$-PPO (Example 15) provided in FIGS. 5 and 6, respectively. With increasing external electric field, U$_{e,discharged}$ exponentially increased up to 22 J/cm$^3$ and 24 J/cm$^3$ for 25 mol % CH$_3$SO$_2$-PPO (Example 13) and 50 mol % CH$_3$SO$_2$-PPO (Example 15), respectively. The discharge energy density, U$_{e,discharged}$ of 50 mol % CH$_3$SO$_2$-PPO (Example 15) increased faster than 25 mol % CH$_3$SO$_2$-PPO (Example 13), likely because 50 mol % CH$_3$SO$_2$-PPO (Example 15) has a higher dielectric constant. However, 25 mol % CH$_3$SO$_2$-PPO (Example 13) exhibited lower dielectric loss and higher discharge efficiency (defined as 100 (1-U$_{e,discharged}$/U$_{e,stored}$)%). For example, upon exposure to an electric field of 805 MV/m, 25 mol % CH$_3$SO$_2$-PPO (Example 13) had a U$_{e,discharged}$ of 18 J/cm$^3$ and a relatively high discharge efficiency about 91% (see FIG. 5B). The discharge efficiency of 50 mol % CH$_3$SO$_2$-PPO (Example 15) at about 635 MV/m was about 85% and dramatically decreased with increased the electric field, as shown in FIG. 6B. These results suggested higher dielectric constant and higher loss with increasing amounts of sulfonyl dipoles. Accordingly, increasing the amount of sulfone groups attached on the side chain of the polymer may not necessarily result in a better dipolar glass polymer.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A sulfone-containing polyphenylene oxide (PPO) polymer having repeating units of formulas:

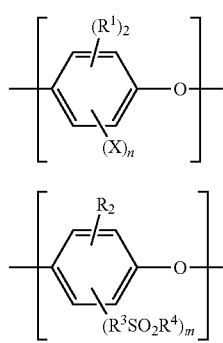

wherein each of $R^1$ and $R^2$ is H or an alkyl group containing from 1 to 4 carbon atoms, $R^3$ is an alkylene group containing from 1 to 2 carbon atoms, $R^4$ is selected from a group consisting of an alkyl group containing from 1 to 4 carbon atoms, an aryl group, and $CF_3$, and X is a halogen atom;

the subscript n is 0 or 1;

the subscript m is 1 or 2, provided that when m is 2, $R^2$ is H;

a degree of polymerization ranges from about 5 to about 1,000; and a ratio of units having formula (1) to units having formula (2) of the sulfone-containing PPO polymer ranges from about 10:90 to about 90:10.

2. The sulfone-containing PPO polymer of claim 1, wherein X is Br.

3. The sulfone-containing PPO polymer of claim 1, wherein $R^1$ is —$CH_3$ or —$CH_2CH_3$.

4. The sulfone-containing PPO polymer of claim 1, wherein $R^3$ is —$CH_2$— or —$CH_2CH_2$— and $R^4$ is $CF_3$.

5. The sulfone-containing PPO polymer of claim 1, wherein $R^3$ is —$CH_2$— or —$CH_2CH_2$— and $R^4$ is an aryl group.

6. The sulfone-containing PPO polymer of claim 5, wherein the aryl group includes one, two, or three substituents selected from the group consisting of —$CH_3$, —$OCH_3$, a dimethyl amino group, and a diethylamino group.

7. The sulfone-containing PPO polymer of claim 6, wherein the aryl group is a para-substituted aryl group and the substituent is selected from the group consisting of a halide, —$CH_3$, —$OCH_3$, a dimethyl amino group, and a diethylamino group.

8. The sulfone-containing PPO polymer of claim 6, wherein the aryl group is an ortho-substituted aryl group and the substituent is selected from the group consisting of a halide, —$CH_3$, —$OCH_3$, a dimethyl amino group, and a diethylamino group.

9. The sulfone-containing PPO polymer of claim 6, wherein the aryl group comprises one para-group and two ortho-groups, each of the ortho-groups is selected from the group consisting of —$CH_3$, —$OCH_3$, a dimethyl amino group, and a diethylamino group.

10. The sulfone-containing PPO polymer of claim 1, wherein an amount of halogen-containing units in the polymer ranges from about 0.2 mol % to about 0.4 mol %.

11. The sulfone-containing PPO polymer of claim 1, wherein units of formula (1) comprise units of formulas:

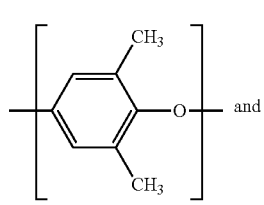

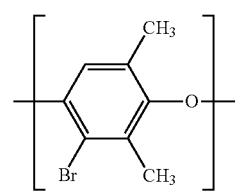

wherein a molar ratio of units of formula (3) to units of formula (4) ranges from about 64:36 to about 99:1.

12. The sulfone-containing PPO polymer of claim 1, wherein units of formula (2) comprise units of formulas:

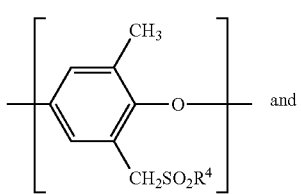

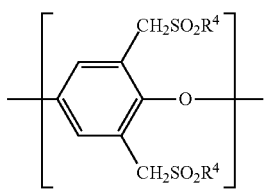

wherein a molar ratio of units of formula (5) to units of formula (6) ranges from about 1:0 to about 5:3.

* * * * *